(12) United States Patent
Connah

(10) Patent No.: US 7,375,424 B2
(45) Date of Patent: May 20, 2008

(54) WIREBONDED DEVICE PACKAGES FOR SEMICONDUCTOR DEVICES HAVING ELONGATED ELECTRODES

(75) Inventor: Norman Glyn Connah, Derbyshire (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/416,037

(22) Filed: May 2, 2006

(65) Prior Publication Data

US 2006/0249831 A1    Nov. 9, 2006

Related U.S. Application Data

(60) Provisional application No. 60/677,308, filed on May 3, 2005.

(51) Int. Cl.
*H01L 23/48*    (2006.01)
(52) U.S. Cl. .............. 257/692; 257/690; 257/720; 257/731
(58) Field of Classification Search ........... 257/690, 257/691, 692, 712, 713, 730, 734, 773, 854, 257/786
See application file for complete search history.

(56) References Cited

U.S. PATENT DOCUMENTS

| 5,019,893 | A | * | 5/1991 | Frank et al. ................. 257/676 |
|---|---|---|---|---|
| 5,751,554 | A | | 5/1998 | Williams et al. ............ 361/760 |
| 6,633,473 | B1 | | 10/2003 | Tomomatsu |
| 6,727,579 | B1 | | 4/2004 | Eldridge et al. |
| 6,759,742 | B2 | | 7/2004 | Budka ........................ 257/728 |
| 2001/0048155 | A1 | | 12/2001 | Budka ........................ 257/727 |
| 2004/0188706 | A1 | | 9/2004 | Chang et al. ............... 257/177 |
| 2004/0208030 | A1 | | 10/2004 | Bhate et al. |
| 2004/0262720 | A1 | * | 12/2004 | Satou et al. ................ 257/676 |
| 2005/0040711 | A1 | * | 2/2005 | West ........................... 307/82 |
| 2005/0082645 | A1 | | 4/2005 | Lee et al. ................... 257/666 |
| 2005/0285228 | A1 | * | 12/2005 | Sugawara ................... 257/584 |
| 2006/0043610 | A1 | | 3/2006 | Maier ......................... 257/784 |
| 2006/0261473 | A1 | * | 11/2006 | Connah et al. ............. 257/728 |

* cited by examiner

*Primary Examiner*—Mary Wilczewski
*Assistant Examiner*—Paul E Patton
(74) *Attorney, Agent, or Firm*—Ostrolenk, Faber, Gerb & Soffen, LLP

(57) ABSTRACT

A device package includes at least one semiconductor device having at least one electrode of an elongated length. The device package also includes at least one conductive pad that extends parallel to the elongated length of the electrode. A terminal lead may be integral with the conductive pad. A plurality of wirebonds of about the same length may electrically connect the conductive pad and the elongated electrode of the semiconductor device. As another alternative, a second semiconductor device may be mounted to the conductive pad and a plurality of wirebonds may electrically connect this second device and the elongated electrode of the first semiconductor device.

15 Claims, 8 Drawing Sheets

WIREBONDED DEVICE PACKAGES FOR SEMICONDUCTOR DEVICES HAVING ELONGATED ELECTRODES

RELATED APPLICATIONS

This application is based on and claims priority to U.S. Provisional Application No. 60/677,308, filed on May 3, 2005, by Glyn Connah, entitled, "WIREBONDED PACKAGE FOR GALLIUM NITRIDE BASED DEVICE," the contents of which are herein incorporated by reference.

BACKGROUND OF THE INVENTION

1. Field of the Invention

This invention relates to semiconductor device packages and more specifically, relates to wirebonded semiconductor device packages having semiconductor devices that include elongated electrodes.

2. Description of the Art

III-nitride based power semiconductor devices, such as Gallium Nitride (GaN) based devices, are desirable for power applications. Example III-nitride based devices include diodes, unidirectional switches, and bi-directional switches. These devices are lateral conductive devices with the power electrodes and control electrodes disposed along a top surface of the devices and with the bottom surface of the devices being electrically non-conductive.

For example, referring to FIG. 1A there is shown a top plan view of a III-nitride unidirectional switching device 10. Device 10 includes a drain electrode 22 and a source electrode 23, which are arranged as interdigitated portions. As shown, each of these electrodes also includes an elongated runner 21 or 24 that extends substantially along the length of the device along respective edges. Runner 21 is connected to the interdigitated portions of drain electrode 22 and runner 24 is connected to the interdigitated portions of source electrode 23. Wirebonds may be formed to the runners to interface with the electrodes. Device 10 also includes a gate electrode 20 formed in a serpentine shape between drain electrode 22 and source electrode 23.

Similarly, referring to FIG. 1B there is shown a top plan view of a III-nitride bi-directional switching device 30. Device 30 may have a form as disclosed in U.S. Publication No. U.S. 2005-0189561 (U.S. patent application. Ser. No. 11/056,062), entitled "III-Nitride Bidirectional Switch," by Daniel M. Kinzer et al., and assigned to the assignee of the present application. The contents of U.S. Publication No. U.S. 2005-0189561 are hereby incorporated by reference as if fully set forth in its entirety herein.

Device 30 includes first and second power electrodes 25 and 26, which are arranged as interdigitated portions. Again, each power electrode includes an elongated runner 42 or 40 that extends substantially along the length of the device, with runner 42 being connected to respective portions of power electrode 25 and runner 40 being connected to respective portions of power electrode 26. Similar to above, wirebonds may be formed to these runners to interface with the power electrodes. Device 30 also includes first and second gate electrodes 32 and 34, with portions of each electrode being disposed between the power electrodes. Elongated runners 46 and 48 are also provided, with runner 46 electrically connecting the portions of gate electrode 32 and runner 48 electrically connecting the portions of gate electrode 34. By controlling each gate electrode, the switch may conduct current in either a forward direction or a reverse direction. Accordingly, either power electrode may serve as the drain or source electrode.

Similarly, for a III-nitride based diode, the device may only include power electrodes.

In general, it is desirable to adapt conventional device package formats, such as TO-220 and SIP package formats, to house III-nitride based semiconductor devices. For example, referring to FIG. 2 there is shown a TO-220 device package 100 of the prior art, this package having a III-nitride based device 101 disposed therein. In this example, device 101 is a III-nitride based unidirectional switching device having a source electrode 23, drain electrode 22, and a gate electrode 20. Device package 100 also includes a lead frame 102 that has a die pad 104 and a plurality of terminal leads, such as leads 110-118. As shown in FIG. 2, the respective bond pads 110a-118a of these terminal leads are typically arranged so as to lie across the bottom of the device package adjacent to the lower edge of die pad 104. Device package 100 also includes a protective housing 105 that covers device 101 and at least a portion of the top surface of lead frame 102.

As shown in FIG. 2, the electrically non-conductive bottom surface of device 101 is mounted to die pad 104 using an adhesive such as solder, epoxy adhesive, or the like, thereby exposing the electrodes along the top surface of the device. Source electrode 23 of device 101 may be electrically connected to terminal lead 112 through a plurality of wirebonds 120 that extend from the runner of the electrode to bond pad 112a. Similarly, drain electrode 22 of device 101 may be electrically connected to terminal lead 118 through a plurality of wirebonds 121 that extend from the runner of the electrode to bond pad 118a. Gate electrode 20 of the device may be electrically connected through wirebond 122 to bond pad 112a of terminal lead 112.

Significantly and as shown in FIG. 2, because the runners of the power electrodes of III-nitride based devices are elongated and because the bond pads of the terminal leads of conventional device packages are typically formed along the bottom of the package, the plurality of wirebonds between respective power electrodes and bond pads are long and of varying/unequal lengths, thereby making the device packages unsuitable. For example, as shown in FIG. 2, the plurality of wirebonds 120 of source electrode 23 and the plurality of wirebonds 121 of drain electrode 22 are long and of varying/unequal lengths. Notably, the long length of the wirebonds increases package resistance, adds unwanted inductance, and also increases cost. The length of the wirebonds also makes the wirebonds susceptible to wire sweep during the mold process of forming protective housing 105. In addition, the unequal lengths of the respective wirebonds of given electrode results in the wirebonds having different resistances, which causes unequal current distribution across the wirebonds. Significantly, the varying lengths of the wirebonds also result in unequal current distribution in the III-nitride based device.

It is noted that similar problems like those described above also occur when packaging silicon based devices that include one or more elongated electrodes.

BRIEF SUMMARY OF THE INVENTION

Accordingly, it is desirable to provide semiconductor device packages for semiconductor devices with elongated electrodes that result in reduced package resistance, equalization of current across the wirebonds, and equalization of current in the device, thereby overcoming the above and other disadvantages of the prior art. According to an embodiment of the invention, a semiconductor device package includes a lead frame having at least one die pad and a plurality of terminal leads. At least one semiconductor device having at least one elongated electrode, such as a III-nitride switching device, is disposed on the die pad such that the elongated electrode is exposed along the top surface of the device.

According to an embodiment of the invention, a bond pad of a terminal lead intended to be connected to the elongated electrode is of an extended length and may extend parallel to and preferably adjacent to the elongated electrode. In addition, the bond pad may extend substantially along the full length of the electrode. In turn, a plurality of wirebonds are formed between the extended bond pad and elongated electrode. Notably, by configuring the bond pad in this fashion, the plurality of wirebonds between the electrode and bond pad may be spaced along the electrode and bond pad in a substantially parallel configuration and may have substantially equal lengths. Because of the substantially equal lengths, the plurality of wirebonds may have substantially the same resistance, thereby equalizing current across the wirebonds and more importantly, equalizing current in the device. In addition, by configuring the bond pad in this extended fashion, the wirebonds may be shortened in length, thereby reducing resistance, inductance, and cost of the device package.

According to another embodiment of the invention, a second semiconductor device may be disposed on the extended bond pad. Here, a plurality of wire bonds may electrically connect an electrode of the second semiconductor device and the elongated electrode of the first device. Again, by configuring the bond pad to extend parallel to the elongated electrode of the first device, the second device may be mounted adjacent to this electrode, thereby allowing the wirebonds to be substantially parallel and of the same length, and of a reduced length.

Other features and advantages of the present invention will become apparent from the following description of the invention, which refers to the accompanying drawings.

DETAIL DESCRIPTION OF THE INVENTION

Figure 1A:
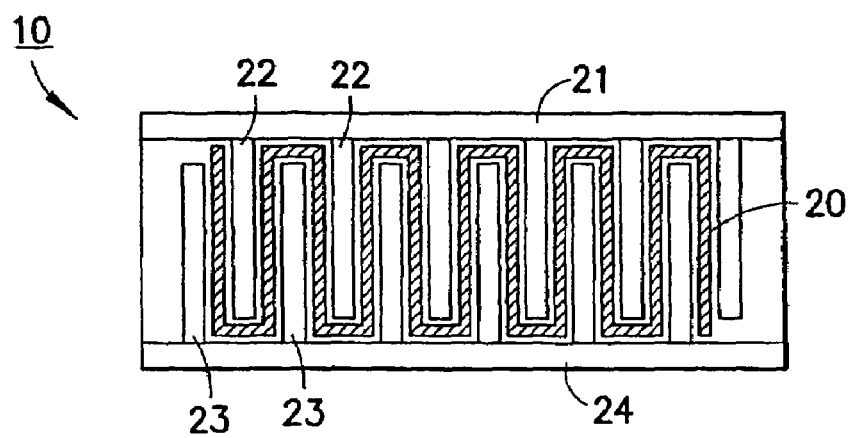
FIG. 1A shows a top plan view of a III-nitride based unidirectional switching device of the prior art.
Figure 1B:
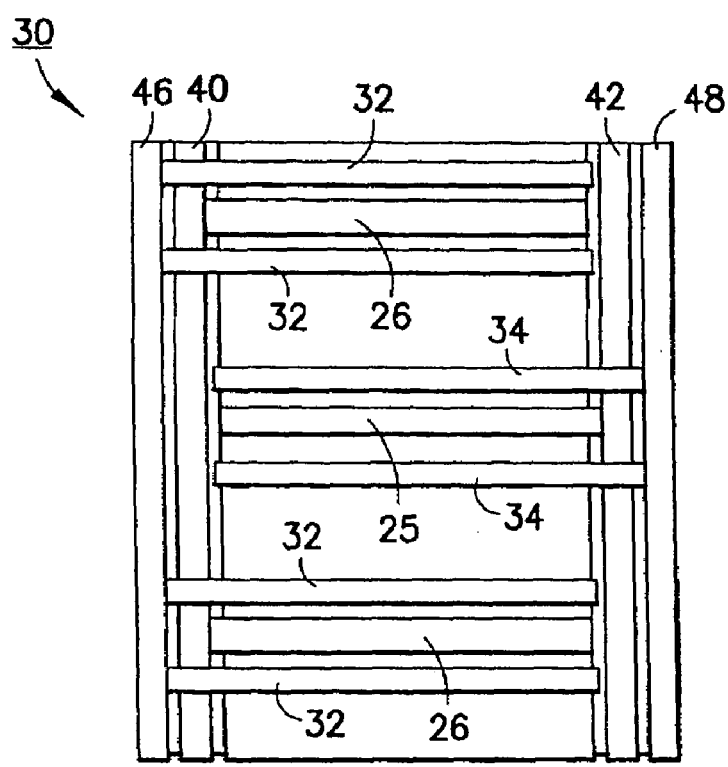
FIG. 1B shows a top plan view of a III-nitride based bi-directional switching device of the prior art.
Figure 2:
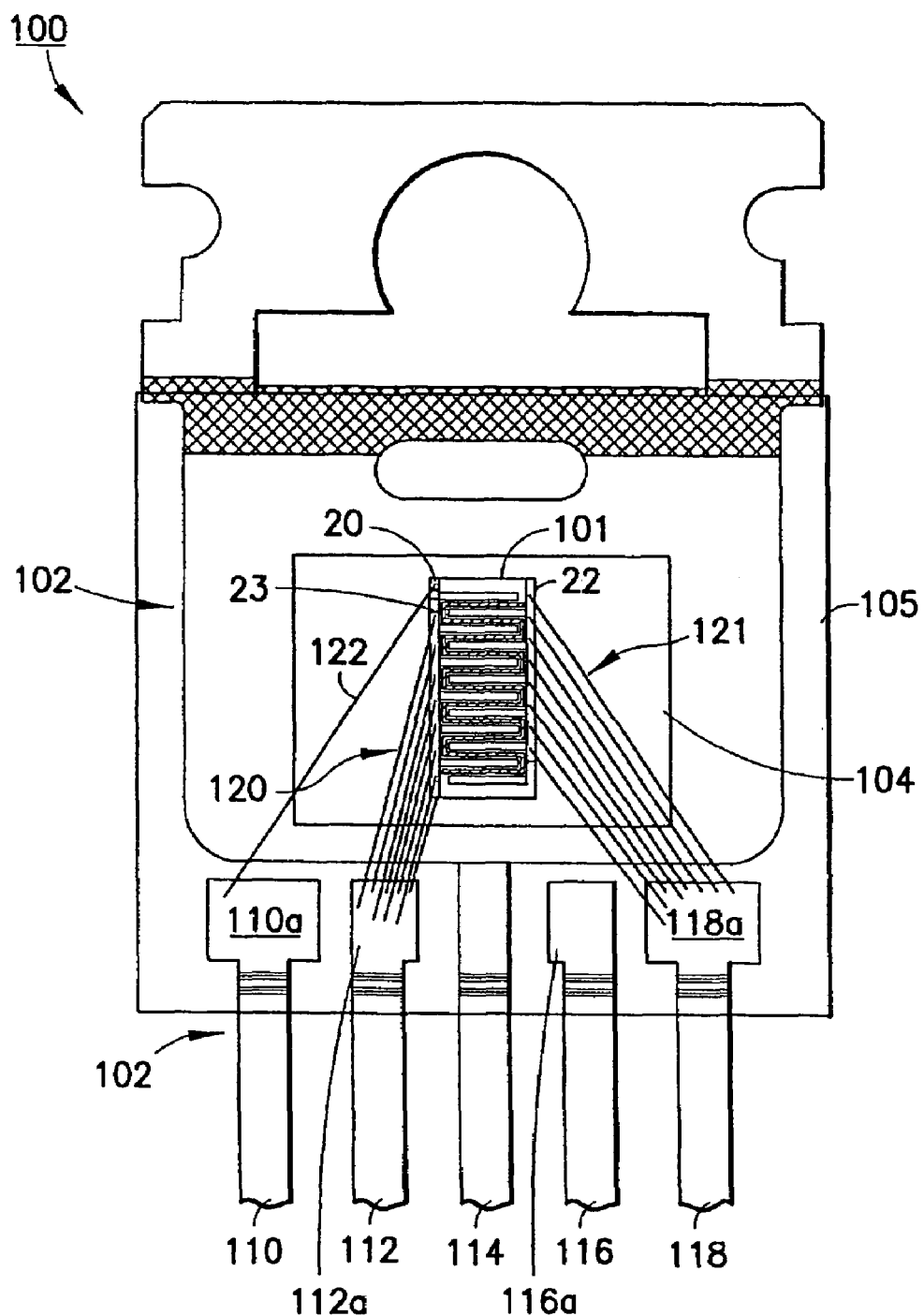
FIG. 2 shows a top plan view of a semiconductor device package of the prior art, the package having a III-nitride based device with power electrodes wirebonded to respective terminal leads by elongated wirebonds of varying lengths.
Figure 3:
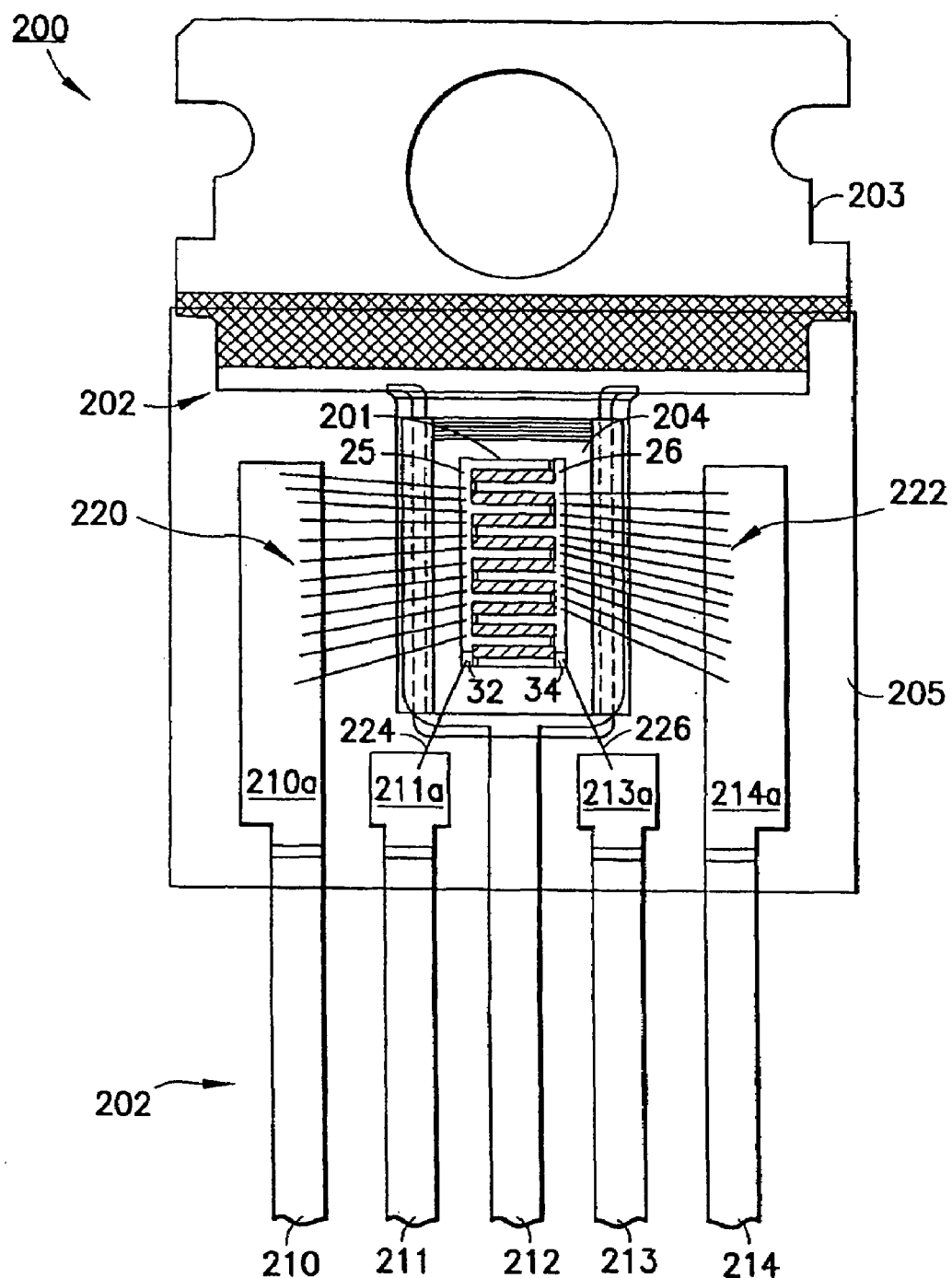
FIG. 3 shows a top plan view of a semiconductor device package according to an embodiment of the invention, the package having a III-nitride based device with power electrodes wirebonded to respective terminal leads by shortened and substantially equal length wirebonds.

Referring to FIG. 3, there is shown a top plan view of a semiconductor device package 200 according to an embodiment of the invention. Device package 200 includes a lead frame 202 having a die pad 204 that is integral with a header 203, and further having a plurality of terminal leads, such as leads 210-214. As shown, one or more terminal leads, such as lead 212, may be integral with die pad 204. One skilled in the art will recognize that while device package 200 is shown as having a single die pad and five terminal leads, a device package according to this embodiment of the invention may have more than one die pad and may have more than or fewer than five terminal leads.

Device package 200 also includes at least one semiconductor device 201 mounted to die pad 204. Device 201 may be a III-nitride based power semiconductor device, such as a GaN-based device, that has one or more elongated electrodes and in particular, may be a unidirectional switch, a bi-directional switch, or a diode. Such a device may also include a temperature sense electrode and/or a current sense electrode, although such electrodes are not essential. Alternatively, device 201 may be a silicon based device that has one more elongated electrodes. According to this example embodiment of the invention, device 201 is a III-nitride bi-directional switching device with first and second power electrodes 25 and 26 and first and second gate electrodes 34 and 32.

Device package 200 also includes a protective/insulated housing 205 that covers device 201 and at least a portion of the top surface of lead frame 202. Housing 205 may also be overmolded and cover at least a portion of the bottom surface of lead frame 202.

As shown in FIG. 3, according to this embodiment of the invention, device package 200 conforms to a TO-220 package format. Here, terminal leads 210-214 are parallel and co-planar with each other and extend from package 200 on the same edge beyond the periphery of protective housing 205. Nonetheless, one skilled in the art will recognize this embodiment of the invention is not limited to a TO-220 package format and device package 200 may conform to other TO formats, such as a TO-247 package format, and more generally, may conform to other package formats, such as a SIP package format.

Referring again to device 201, as indicated above, according to this example embodiment of the invention, the device is III-nitride bi-directional switching device. As shown in FIG. 3, the electrically non-conductive bottom surface of the device is mounted to die pad 204 using an adhesive such as solder, epoxy adhesive, or the like, thereby exposing the electrodes along the top surface of the device. Notably, mounting the bottom surface of device 201 to die pad 204 provides for good heat removal from the bottom surface of the device.

As further shown in FIG. 3, the elongated runner of first power electrode 25 of device 201 may be electrically connected through a plurality of wirebonds 220 to bond pad 210a of terminal lead 210, and the elongated runner of second power electrode 26 may be electrically connected through a plurality of wirebonds 222 to bond pad 214a of terminal lead 214. Similarly, first gate electrode 34 of device 201 may be electrically connected through wirebond 224 to bond pad 211a of terminal lead 211 and second gate electrode 32 may be electrically connected through wirebond 226 to bond pad 213a of terminal lead 213. Wirebonds 220-226 may be formed, for example, of gold or aluminum. One skilled in the art will recognize that other electrode-to-terminal lead assignments of device package 200 are possible without deviating from the present invention.

Significantly and according to an embodiment of the invention, conductive bond pads 210a and 214a connected to the elongated power electrodes 25 and 26 of device 201 are of an extended length, as shown in FIG. 3. Specifically, these bond pads extend up to and preferably adjacent to opposing peripheral side-edges of die pad 204 and in particular, extend parallel to and preferably adjacent to the elongated length of power electrodes 25 and 26 of device 201. As further shown in FIG. 3, these bond pads may extend substantially along the full length of the power electrodes. Notably, by configuring the bond pads in this fashion, each of the plurality of wirebonds 220 and each of the plurality of wirebonds 222 between the respective power electrodes and bond pads may be spaced along the electrodes and bond pads in a substantially parallel configuration and may be substantially the same length (i.e., about equal length). Because of the substantially equal lengths, the plurality of wirebonds of a given electrode/bond pad may have substantially the same resistance, thereby equalizing current across the wirebonds and more importantly, equalizing current in device 201. In addition, by configuring the bond pads in this extended fashion, wirebonds 220 and wirebonds 222 may be shortened in length, thereby reducing resistance, inductance, and cost of device package 200.

One skilled in the art will recognize that other configurations for extending a bond pad to be parallel to the elongated length of an electrode are possible without deviating from the present invention. In particular, specific configurations may depend, for example, on the type of device 201, the positioning of the device within the device package, and the intended target application.

In addition, rather than having two terminal leads each with a bond pad that is parallel to a given elongated electrode as shown in FIG. 3, the bond pad of only one terminal lead may be so configured. Similarly, more than two terminal leads may have bond pads that are parallel to respective elongated electrodes. Furthermore, multiple terminal leads may be integral with a single bond pad that is parallel to a given elongated electrode, thereby electrically connecting the electrode to multiple leads.

Figure 4:
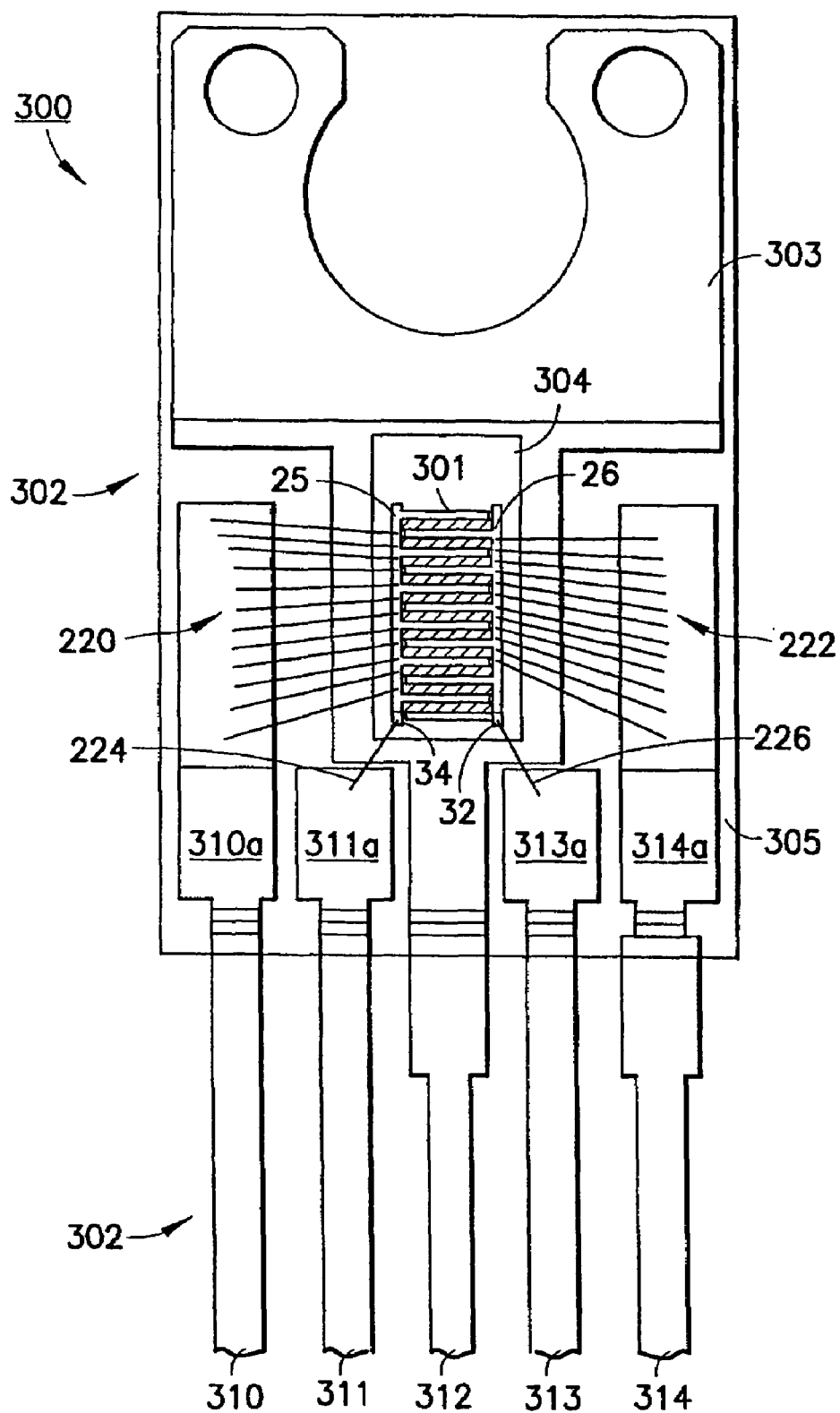
FIG. 4 shows a top plan view of a semiconductor device package according to another embodiment of the invention, the package being similar to that of FIG. 3.

Referring now to FIG. 4 in which similar reference numerals refer to similar elements, there is shown a top plan view of a device package 300 according to another embodiment of the invention. Device package 300 is substantially similar to device package 200 but conforms to a TO-220 Full-Pak package format. In particular, device package 300 includes a lead frame having a die pad 304 integral with a header 303, and having a plurality of terminal leads 310-314 that extend from package 300 on the same edge beyond the periphery of a protective housing 305, which extends over portions of the top and bottom surfaces of the lead frame. Again, one skilled in the art will recognize that device package 300 may include more than one die pad and may have more than or fewer than five terminal leads without deviating from the present invention.

Device package 300 also includes at least one semiconductor device 301. According to this example embodiment of the invention and similar to device package 200, device 301 is a III-nitride bi-directional switching device with elongated power electrodes 25 and 26. Nonetheless, one skilled in the art will recognize that device package 300 may include other types of III-nitride based semiconductor devices or may include a silicon based device that has one more elongated electrodes. Similar to device package 200, device 301 is mounted to die pad 304 and has the elongated runners of its first and second power electrode 25 and 26 wirebonded to bond pads 310a and 314a of terminal leads 310 and 314, respectively. Similarly, the first and second gate electrodes 34 and 32 of device 301 are wirebonded to bond pads 311a and 313a of terminal leads 311 and 313, respectively. Again, one skilled in the art will recognize that device package 300 is not limited to the electrode-to-terminal lead assignments shown in FIG. 4.

According to this embodiment of the invention and similar to device package 200, bond pads 310a and 314a are configured to extend parallel to the elongated length of power electrodes 25 and 26 of device 301, thereby allowing respective wirebonds 220 and 222 to be substantially parallel and of the same length, and also of a reduced length. One skilled in the art will again recognize that other bond pad configurations are possible, as similarly described above.

Figure 5:
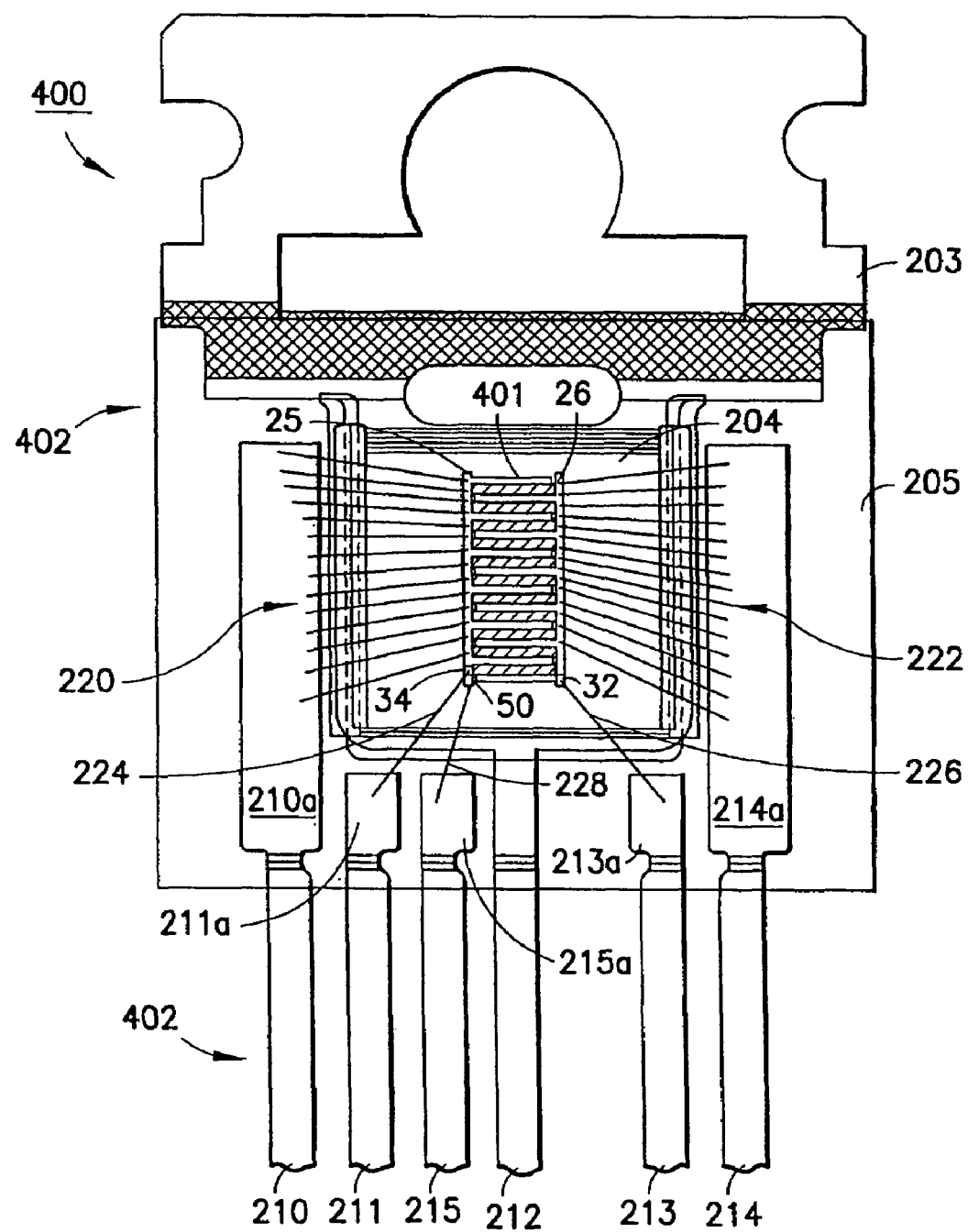
FIG. 5 shows a top plan view of a semiconductor device package according to another embodiment of the invention, the package being similar to that of FIG. 3.

Referring now to FIG. 5 in which similar reference numerals refer to similar elements, there is shown a top plan view of a device package 400 according to another embodiment of the invention. Device package 400 is substantially similar to device package 200 and conforms to a TO-220 package format, although other package formats may be used. According to this embodiment of the invention, device package 400 includes a lead frame 402 that has a sixth additional terminal lead 215, although device package 400 may have more than or fewer than six terminal leads. Device package 400 also includes at least one semiconductor device 401 mounted to die pad 204. According to this embodiment of the invention, device 401 includes a current sense electrode 50 for sensing the current through device 401. According to this example embodiment of the invention, device 401 is a III-nitride bi-directional switching device with first and second power electrodes 25 and 26 and first and second gate electrodes 34 and 32. Nonetheless, one skilled in the art will recognize that device 401 may be a different type of semiconductor device, such as III-nitride unidirectional switching device or a silicon based switching device with one or more elongated electrodes.

Similar to device package 200, first and second power electrodes 25 and 26 and first and second gate electrodes 34 and 32 of device 401 are electrically connected to terminal leads 210, 211, 213, and 214 of lead frame 402. In addition, current sense electrode 50 is now electrically connected through wirebond 228 to bond pad 214a of terminal lead 215. Again, one skilled in the art will recognize that device package 400 is not limited to the electrode-to-terminal lead assignments shown in FIG. 5. One skilled in the art will also recognize that other bond pad configurations are possible, as similarly described above.

Figure 6:
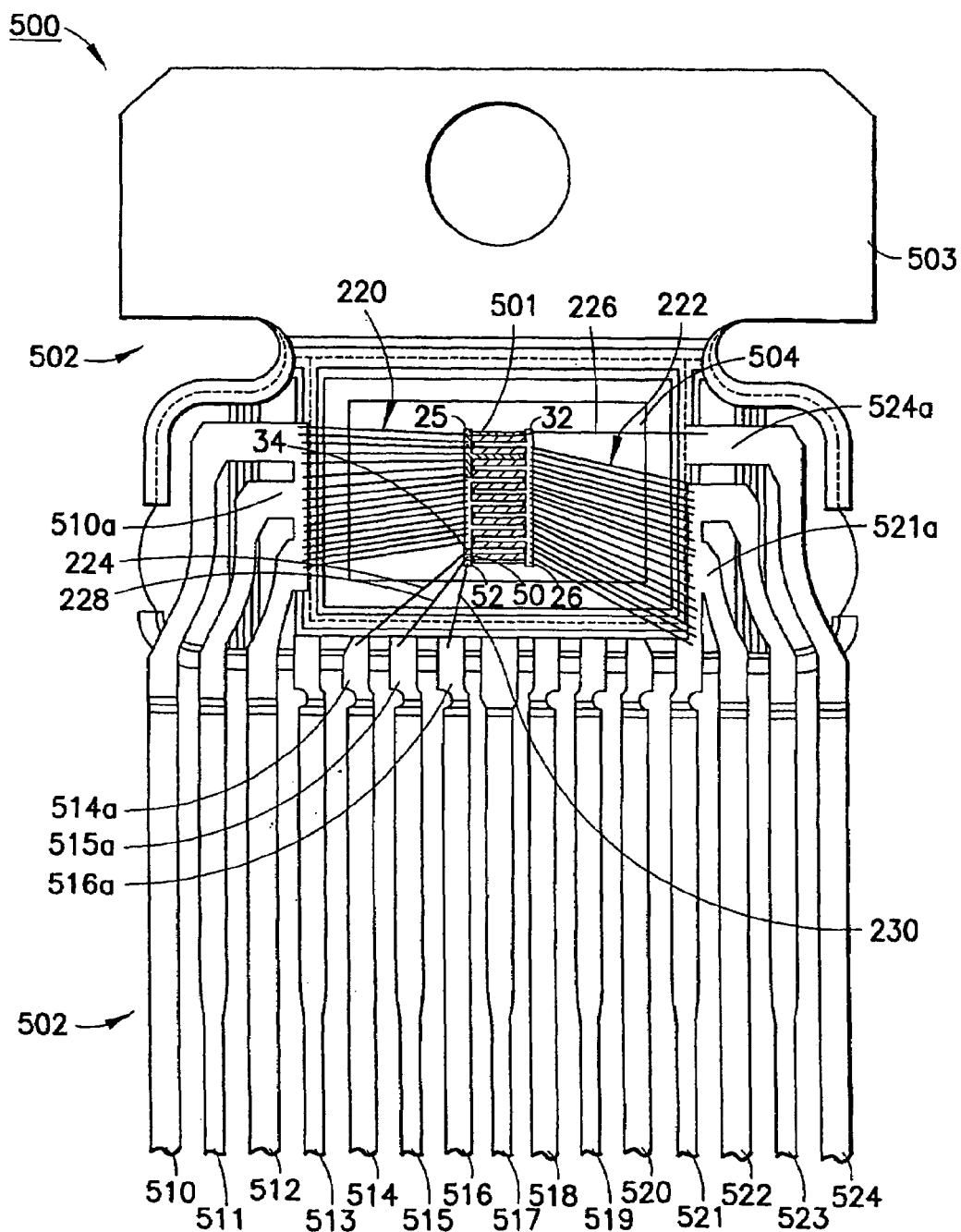
FIG. 6 shows a top plan view of a semiconductor device package according to another embodiment of the invention, the package having a III-nitride based device with power electrodes wirebonded to multiple terminal leads by shortened and substantially equal length wirebonds.

Referring now to FIG. 6, there is shown a top plan view of a semiconductor device package 500 according to another embodiment of the invention. Device package 500 conforms to a SIP15 package format and includes a lead frame 502 having a die pad 504 that is integral with a header 503, and having a plurality of terminal leads 510-524 that are parallel and co-planar and extend from package 500 on the same edge beyond the periphery of a protective housing. Note that FIG. 6 does not show the protective housing for ease of illustration. Device package 500 may be used to house larger die such as variations of the III-nitride based die shown. One skilled in the art will recognize that device package 500 is not limited to a single die pad and fifteen terminal leads, as shown in FIG. 6. One skilled in the art will also recognize that this embodiment of the invention is not limited to a SIP15 package format and may conform to other package formats. For example, a modified TO-247 package format may also be used to house larger die, such as variations of the III-nitride based die shown in FIG. 6. Similar to the above described embodiments, such a package may include a die pad with a device mounted thereon, and one or more bond pads that extend parallel to and adjacent to the elongated length of the device electrodes.

Referring again to FIG. 6, device package 500 also includes at least one semiconductor device 501 mounted to die pad 504. According to this example embodiment of the invention, device 501 is a III-nitride bi-directional switching device with first and second power electrodes 25 and 26, first and second gate electrodes 34 and 32, current sense electrode 50, and temperature sense electrode 52, although the current sense and temperature sense electrodes are not essential. One skilled in the art will also recognize that device package 500 is not limited to a III-nitride bi-directional switching device and may include a different type of III-nitride based device, or may include a silicon based device with one or more elongated electrodes, for example.

According to this example embodiment of the invention, the electrically non-conductive bottom surface of device 501 is mounted to die pad 504 using an adhesive, thereby exposing the electrodes on the top surface of the device. As shown in FIG. 6, first gate electrode 34 of device 501 may be electrically connected through wire bond 224 to bond pad 514a of terminal lead 514 and second gate electrode 32 may be electrically connected through wire bond 226 to bond pad 524a of terminal lead 524. Similarly, current sense electrode 50 may be electrically connected through wirebond 228 to bond pad 515a of terminal lead 515 and temperature sense electrode 52 may be electrically connected through wirebond 230 to bond pad 516a of terminal lead 516.

In addition, the elongated runner of first power electrode 25 of device 501 may be electrically connected through a plurality of wirebonds 220 to bond pad 510a and second power electrode 26 may be electrically connected through a plurality of wirebonds 222 to bond pad 521a. Similar to the above described device packages, bond pads 510a and 521a are configured to extend parallel to the elongated length of power electrodes 25 and 26 of device 501 and may extend substantially along the full length of these power electrodes, as shown in FIG. 6. Again, this configuration allows each of the plurality of wirebonds 220 and 222 between the respective power electrodes and bond pads to be substantially parallel and the same length, and to also have a reduced length. In addition, according to this embodiment of the invention each of bond pads 510a and 521a are now also integral with a plurality of terminal leads, such as leads 510-512 and leads 521-523, respectively, thereby electrically connecting each power electrode to multiple terminal leads. Again, one skilled in the art will recognize that other electrode-to-terminal lead assignments are possible and that other bond pad configurations are possible, as similarly described above.

Figure 7:
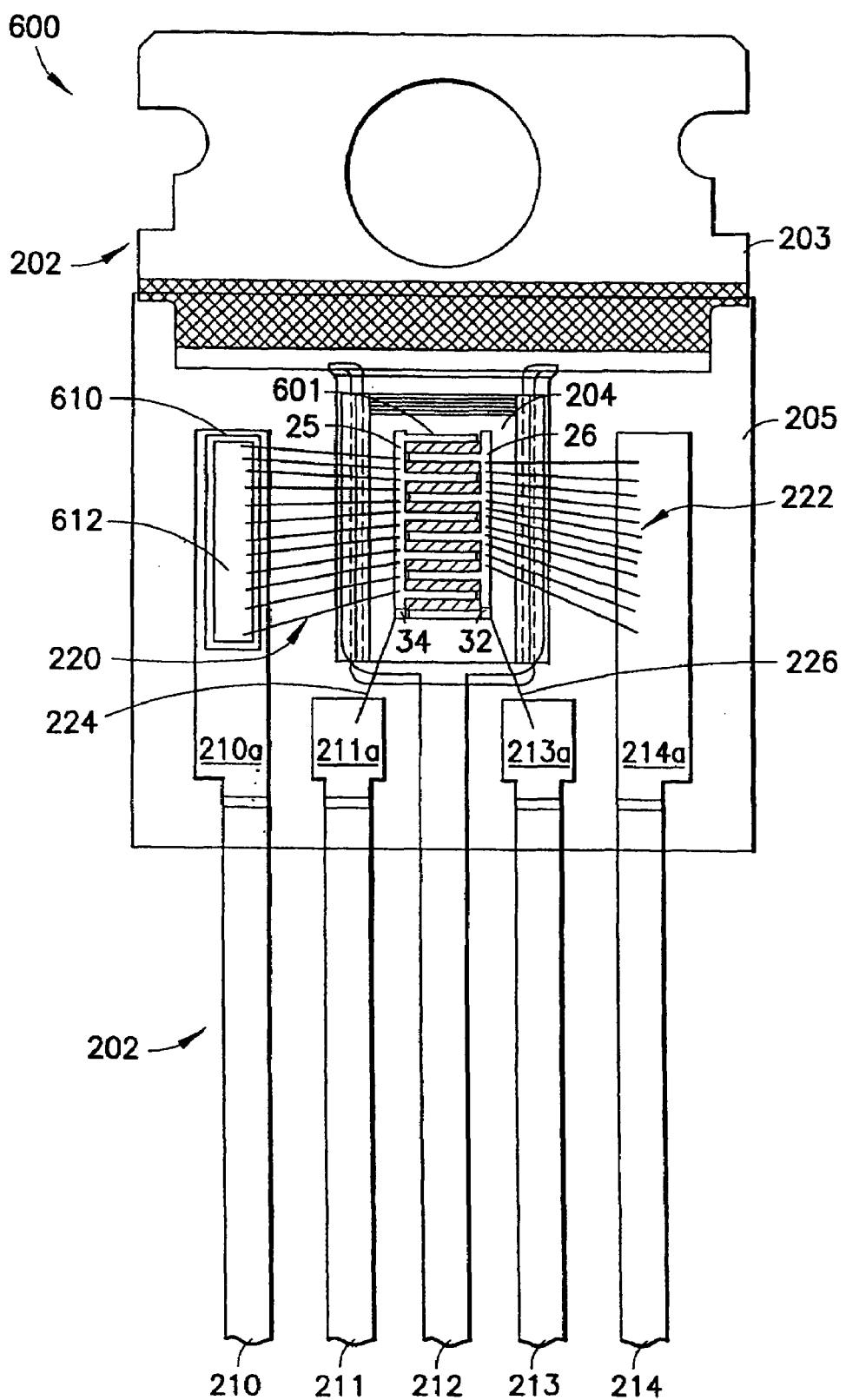
FIG. 7 shows a top plan view of a semiconductor device package according to another embodiment of the invention, the package having two semiconductor devices interconnected to form a circuit.

Referring now to FIG. 7 in which similar reference numerals refer to similar elements, there is shown a top plan view of a semiconductor device package 600 according to another embodiment of the invention. Device package 600 is substantially similar to device package 200 and conforms to a TO-220 package format, although other package formats may be used. One skilled in the art will also recognize that device package 600 is not limited to a single die pad 204 and five terminal leads 210-214, as shown in FIG. 7.

Figure 8:
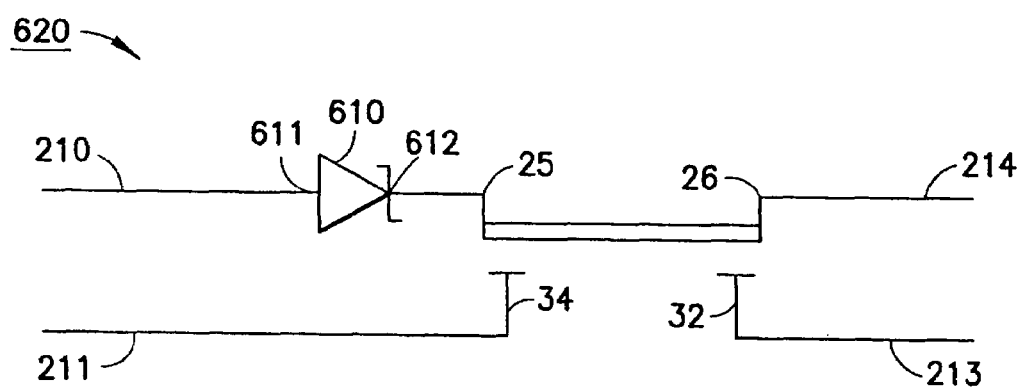
FIG. 8 shows a schematic of the circuit formed by the interconnected devices of the semiconductor device package of FIG. 8, according to an embodiment of the invention.

According to this embodiment of the invention, device package 600 now includes two or more semiconductor devices, such as device 601 and device 610, which may be interconnected to form a circuit. Each device may be a III-nitride based power semiconductor device, may be a silicon based device, or may be some combination thereof, for example. According to this example embodiment of the invention, device 601 is a III-nitride bi-directional switching device with first and second power electrodes 25 and 26 and first and second gate electrodes 34 and 32, and device 610 is a silicon based vertical conduction diode with anode electrode 611 and cathode electrode 612 on opposing surfaces of the device. Devices 601 and 610 are interconnected to form a circuit 620, as schematically shown in FIG. 8. Again, one skilled in the art will recognize that the present invention is not limited to this circuit configuration and other configurations are possible.

In particular, according to this embodiment of the invention, diode 610 is mounted in a flip-chip orientation directly to extended bond pad 210a using a conductive adhesive such that anode electrode 611 of the diode is in electrical contact with terminal lead 210. Similar to device package 200, bi-directional switching device 601 is mounted to die pad 204 and has the elongated runner of its second power electrode 26 wirebonded to extended bond pad 214a of terminal lead 214. Similarly, the first and second gate electrodes 34 and 32 of device 601 are wirebonded to bond pads 211a and 213a of terminal leads 211 and 213, respectively. According to this embodiment of the invention, the elongated runner of first power electrode 25 of device 601 is wirebonded by a plurality of wirebonds 220 to cathode electrode 612 of diode 610.

Significantly and as shown in FIG. 7, by forming bond pad 210a to extend adjacent to and parallel to the elongated length of first power electrode 25 of device 601, diode 610 may be mounted adjacent to this power electrode, thereby allowing wirebonds 220 to be substantially parallel and of the same length, and of a reduced length. Again, this allows for reduced resistance, inductance, and cost, and also allows for equalization of current across the wirebonds and in device 601.

Again, one skilled in the art will recognize that other electrode-to-terminal lead assignments of device package 600 are possible, and that other bond pad configurations are also possible, as similarly described above.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device package comprising:
   a power semiconductor device having a first elongated electrode extending along one edge thereof and a second elongated electrode extending along a second edge thereof opposite said first edge;
   a lead frame having a first lead and a second lead, each of said first lead and said second lead including a conductive pad disposed opposite and extending along a respective one of said first electrode and said second electrode and a terminal lead integral with said conductive pad;

a plurality of wirebonds electrically connecting each said electrode to a respective oppositely disposed conductive pad; and a protective housing enclosing said power semiconductor device and a portion of said leads.

2. The semiconductor device package of claim 1, wherein each said electrode extends substantially along a length of said power semiconductor device.

3. The semiconductor device package of claim 1, wherein each said plurality of wirebonds are substantially parallel and are about equal length.

4. The semiconductor device package of claim 1, wherein each said plurality of wirebonds have about a same electrical resistance.

5. The semiconductor device package of claim 1, wherein said power semiconductor device is a III-nitride based device.

6. The semiconductor device package of claim 5, wherein said power semiconductor device is a GaN-based device.

7. The semiconductor device package of claim 5, wherein said power semiconductor device is a switching device.

8. The semiconductor device package of claim 1, wherein said device package conforms to a TO-220 package format.

9. The semiconductor device package of claim 1, wherein said device package conforms to a TO-247 package format.

10. The semiconductor device package of claim 1, wherein said device package conforms to a Full-Pak package format.

11. The semiconductor device package of claim 1, wherein said device package conforms to a SIP package format.

12. The semiconductor device package of claim 1, wherein said power semiconductor device further includes a current sense electrode.

13. The semiconductor device package of claim 1, wherein said power semiconductor device further includes a temperature sense electrode.

14. A semiconductor device package comprising:

a first power semiconductor device having a first electrode extending along a first edge thereof and a second electrode extending along a second edge thereof opposite said first edge;

a lead frame having a first lead and a second lead, each of said first and second lead including a conductive pad disposed opposite and extending along a respective one of said first electrode and said second electrode and a terminal lead integral with said conductive pad;

a second power semiconductor device disposed on said conductive pad of said first lead and having an electrode on a top surface thereof;

a plurality of wirebonds electrically connecting said conductive pad of said second lead to said second electrode;

a plurality of wirebonds electrically connecting said first electrode of said first power semiconductor device to said electrode of said second power semiconductor device; and a protective housing enclosing said first and second power semiconductor devices and a portion of said lead frame.

15. The semiconductor device package of claim 14, wherein said first power semiconductor device is a III-nitride bi-directional switching device and said second power semiconductor device is a diode, and wherein said electrode of said diode is a cathode electrode.

* * * * *